(12) United States Patent
Ohtsuka et al.

(10) Patent No.: US 6,570,802 B2
(45) Date of Patent: May 27, 2003

(54) SEMICONDUCTOR MEMORY DEVICE

(75) Inventors: Hidefumi Ohtsuka, Takatsuki (JP);
Yuji Yamasaki, Mishima-gun (JP);
Tomonori Fujimoto, Neyagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/008,709

(22) Filed: Nov. 13, 2001

(65) Prior Publication Data

US 2002/0057616 A1 May 16, 2002

(30) Foreign Application Priority Data

Nov. 15, 2000 (JP) ........................................ 2000-348443

(51) Int. Cl.[7] ................................................ G11C 7/00
(52) U.S. Cl. .................. 365/222; 365/230.03; 365/233
(58) Field of Search ............................ 365/222, 230.03, 365/233, 236

(56) References Cited

U.S. PATENT DOCUMENTS

| | | | |
|---|---|---|---|
| 4,933,907 A | | 6/1990 | Kumanoya et al. ......... 365/222 |
| 5,469,559 A | | 11/1995 | Parks et al. .................. 395/433 |
| 5,511,033 A | * | 4/1996 | Jung ........................... 365/222 |
| 5,644,545 A | * | 7/1997 | Fisch .......................... 365/222 |
| 5,825,705 A | * | 10/1998 | Tsukude et al. ............. 365/222 |
| 5,999,472 A | * | 12/1999 | Sakurai ....................... 365/222 |
| 6,023,440 A | * | 2/2000 | Kotani et al. .......... 365/230.03 |
| 6,141,288 A | * | 10/2000 | Numata et al. ........ 365/230.03 |

* cited by examiner

*Primary Examiner*—David Nelms
*Assistant Examiner*—Gene N. Auduong
(74) *Attorney, Agent, or Firm*—Merchant & Gould P.C.

(57) ABSTRACT

A semiconductor memory device including a memory cell array having a plurality of memory cells requiring refresh, a first internal address generation circuit, a timer circuit that operates in response to a control signal input externally and generates a periodic pulse signal, and a second internal address generation circuit that operates in response to an output signal from the timer circuit. The first internal address generation circuit generates a refresh address of the entire memory region, and the second internal address generation circuit generates a refresh address of a certain part of the regions. By carrying out refresh of only a part of the memory required to be retained, the electric power consumption can be reduced.

11 Claims, 18 Drawing Sheets

SEMICONDUCTOR MEMORY DEVICE

FIELD OF THE INVENTION

The present invention relates to a method for refreshing a semiconductor memory device, in particular, a DRAM (Dynamic Random Access Memory).

BACKGROUND OF THE INVENTION

In recent years, as miniaturization and lower power consumption of a system have been developed, a lower power consumption of semiconductor device has been demanded strongly. In a semiconductor memory device such as a DRAM that requires refresh, not only low power consumption during the operation but also the reduction of refresh current during standby (in the sleep mode, etc.) has been demanded.

A conventional refreshing function will be explained in the following. In a DRAM in which a memory cell is formed of a capacitor, with the passage of a predetermined time, data stored as an electric charge in the memory cell are lost by a leak current. Therefore, in order to rewrite and maintain data stored in the memory cell, a refresh operation is required. In the memory matrix composed of a plurality of rows and columns of the memory cell, the refresh operation in a DRAM is carried out as follows. One line of rows (a word line) is selected, and data with respect to all the memory cells on the word line are read out, amplified and rewritten. These operations are carried out repeatedly with respect to all word lines.

The DRAM refresh operation includes the refresh operation carried out by interrupting the random access operation accompanying the reading out/writing of data with respect to the memory cell, and the refresh operation carried out during the data retaining mode, for example, during a battery back-up period.

The former refresh operation carried out during the random access operation is classified into two types: one is a row address strobe signal 6 (hereinafter referred to as RAS) only refresh method in which a row address for refresh is provided from the outside and the refresh is carried out during a period from a rise of a row address strobe signal RAS and a fall thereof, and another is an auto-refresh method in which a refresh request signal is provided from the outside to carry out refresh by switching the row address from the outside address to the address supplied by the refresh address counter contained in the DRAM.

The latter refresh operation, that is, the refresh operation in the data retaining mode, includes a self-refresh method. In the self-refresh method, in accordance with the refresh request signal automatically generated by an inner timer, the refresh is carried out by using an output from the built-in refresh address counter as a row address, thereby refreshing at the constant period without providing a control signal from the outside.

These conventional DRAM refresh methods will be explained with reference to the drawings. FIG. 14 shows an example of a configuration of a circuit for carrying out a conventional refresh method. In FIG. 14, reference numeral 1 denotes a memory cell array; 2 denotes a row decode circuit for selecting a row line (hereinafter, referred to as a word line) according to a given row address; 3 denotes a column decode circuit for selecting a bit line according to the given column address; 4 denotes a sense amplifier and I/O bus column for carrying out the operation to read out and write data with respect to the memory cell that is present at an intersection between a word line selected by the row decode circuit 2 and a bit line selected by the column decode circuit 3.

Reference numeral 5 denotes a timing generation circuit for generating a timing signal to read out and write data with respect to the memory cell in the memory cell array 1. This timing generation circuit 5 generates a necessary timing signal 12 using an OR signal 10 output from an OR circuit 15 and a column address strobe signal 11 (hereinafter, referred to as CAS). Into the OR circuit 15, a RAS 6, an auto-refresh signal 7 (hereinafter, referred to as AUT) used for the row address strobe signal at the time of the auto-refresh time and an address strobe signal for self-refresh 9 (an output signal from the timer generation circuit A 8) are input.

The timer circuit A 8 receives a self-refresh mode control signal (hereinafter, referred to as SLF) 13 and outputs "L" when SLF="L" is satisfied, and outputs an address strobe signal for refresh when SLF="H" is satisfied. An example of the circuit and the operation of the timer circuit A 8 will be explained hereinafter.

The address generation circuit A14 is composed of a refresh address counter generating an entire row address. As a clock input for count-up of the refresh address counter, the OR signal 10 output from the OR circuit 15 is used. With this configuration, which is similar in the general operation, in accordance with the rise of a row address strobe signal for auto-refresh and self-refresh, addresses are counted up and the entire memory regions are refreshed.

Furthermore, during the general operation, for selecting the address from the outside, an output of an address generation circuit A 14 and an outside row address 16 are switched by the selector 17 by using an OR signal 18, which is output from the OR circuit 15a using the row address strobe signal for self-refresh 9 (an output signal from the timer circuit A 8) and the auto-refresh control signal 7.

Next, an example of the timer circuit A 8 and the address generation circuit A14 will be explained.

First, the operation of the timer circuit A 8 will be explained with reference to the example of the circuit shown in FIG. 15. As shown in FIG. 15, the timer circuit A 8 includes an oscillation circuit 20, a frequency dividing circuit A 21 and a signal generation circuit 22. When a RST (reset) signal 23 is "L", "L" is output as an output signal 24 of the signal generation circuit 22, and in the oscillation circuit 20, the output is fixed to "H". When the RST signal 23 becomes "H", the oscillation circuit 20 operates, a periodic pulse generated from the oscillation circuit 20 is frequency-divided by the frequency dividing circuit A 21, and a periodic signal is generated by the signal generation circuit 22. The periodic signal has "H" period corresponding to the delay amount by a delay circuit 25 and toggles at the period of the pulse frequency-divided by the frequency dividing circuit A 21. The delay circuit 25 is composed of plural stages of buffer circuits, etc.

FIG. 16 is an example of the frequency dividing circuit A 21. The frequency dividing circuit A 21 is composed by using a counter circuit 26 with load. Using the load value of the counter circuit 26, the frequency-dividing ratio is determined. FIG. 16 shows an example of a quarter frequency circuit. By applying this quarter frequency circuit, the period of the pulse generated from the oscillation circuit 20 becomes 4 times. The counter circuit 26 with load may be composed of, for example, as shown in FIG. 17, a D-flip flop 27, an adder 28 and an AND gate 29.

Next, the address generation circuit A 14 will be explained with reference to an example of a circuit shown in FIG. 18. As shown in FIG. 18, the address generation circuit A 14 includes a counter 19. The number of the bits of the counter 19 is the same as the number of the bits of the row address. FIG. 18 shows a configuration of the circuit for an 8-bit row address. As the counter 19, for example, an embodiment of a circuit shown in FIG. 3 is used. The counter shown in FIG. 3 includes a D-flip flop 30, an adder 31 and an AND gate 32. FIG. 3 shows an example of a 4-bit counter. However, by using a circuit unit 33 for the higher bits repeatedly, it is possible to increase the number of bits of the counter.

As is apparent from the above explanation, in the conventional circuit, in both the auto-refresh time and self-refresh time, all data in the memory cell array are refreshed. However, when all data in the memory cell array 1 are refreshed, the electric power consumption during the system standby (in the sleep mode, etc.) is large. Some systems are not required to retain all data in the memory cell array 1 but are required to retain a part of data during standby (in the sleep mode, etc.). If the conventional configuration is used for such a system, more electric power than necessary is consumed.

Furthermore, in the semiconductor memory device such as DRAM etc. having a short refresh time, it is necessary to shorten the refresh period, which leads to a waste of much electric power. Therefore, in the case of a portable terminal system, the time capable of continuous use with a battery, etc. becomes short, which may lead to a serious problem.

SUMMARY OF THE INVENTION

With the foregoing in mind, it is a first object of the present invention to provide a semiconductor memory device that can reduce the electric power consumption during standby by carrying out refresh with respect to a part of the memory cell that is required to be retained.

It is a second object of the present invention to increase the refresh period by reducing a region to be refreshed and setting to the optimum refresh period, thus enabling the electric power consumption to be lowered.

In order to achieve the above-mentioned objects, the semiconductor memory device of the present invention includes a plurality of refresh modes and generates plural kinds of addresses capable of refreshing the different memory regions as internally generated refresh addresses.

According to a first basic configuration of the present invention, a semiconductor memory device includes a memory cell array having a plurality of memory cells requiring refresh, a first internal address generation circuit, a timer circuit that operates in response to a control signal input externally and generates a periodic pulse signal, and a second internal address generation circuit that operates in response to an output signal from the timer circuit, and has first, second and third refresh modes. In the first refresh mode, refresh is carried out by using a periodic pulse signal input from the outside and a refresh address generated from the first internal address generation circuit that operates in response to the periodic pulse signal input externally. In the second refresh mode, the refresh is carried out by using a periodic pulse signal generated externally and a refresh address generated from the second internal address generation circuit. Different memory regions are refreshed in the first refresh mode versus the second refresh mode.

With such a configuration, it is possible to change the refresh addresses to be generated between the case where the refresh is carried out in response to the periodic pulse signal input externally and the case where the refresh is carried out in response to the periodic pulse signal generated internally. Thus, it is possible to reduce the memory regions to be refreshed in accordance with the circumferences. Therefore, it is possible to save the electric current consumption at the time of refresh, thus saving the electric power consumption at the time of refresh.

In the above-mentioned configuration of the semiconductor memory device, a refresh address generated from the first internal address generation circuit is used for refreshing the entire memory region and a refresh address generated from the second internal address generation circuit is used for refreshing only the memory cells in a specific part of the memory region.

The second configuration of the semiconductor memory device according to the present invention includes a memory cell array having a plurality of memory cells requiring refresh, a first internal address generation circuit, a timer circuit that operates in response to a control signal input externally and generates a periodic pulse signal, and a second internal address generation circuit that operates in response to the output signal from the timer circuit, and has first, second and third refresh modes. In the first refresh mode, the refresh is carried out by using a periodic pulse signal input from the outside and a refresh address generated from the first internal address generation circuit that operates in response to the periodic pulse signal input externally. In the second refresh mode, the refresh is carried out by using a periodic pulse signal generated from the timer circuit and a refresh address generated from the first internal address generation circuit that operates in response to the internally generated pulse signal. In the third refresh mode, the refresh is carried out by using a periodic pulse signal generated from the timer circuit and the refresh address generated from the second internal address generation circuit. In the first refresh mode and the second refresh mode, the same memory region is refreshed, and in the third refresh mode, a memory region that is different from the memory regions which are refreshed by the first and the second refresh modes is refreshed.

With such a configuration, similar to the first basic configuration, it is possible to reduce the memory regions to be refreshed in accordance with the circumstances. Therefore, it is possible to reduce the electric current consumption at the time of refresh, thus saving the electric power consumption at the time of refresh.

In the semiconductor memory device according to the above-mentioned basic configuration, the refresh address generated from the first internal address generation circuit is used for the refresh of the entire memory region and the refresh address generated from the second address generation circuit is used for the refresh of only the memory cell of a part of the memory region.

In the semiconductor memory device of the above-mentioned first or second basic configuration, the first internal address generation circuit and the second internal address generation circuit includes respective counters and the refresh regions are changed depending upon the number of bits of each of the counter.

Furthermore, in the semiconductor memory device according to the above-mentioned first or second basic configuration, the second internal address generation circuit includes a counter, a comparison circuit and an adder. Output data of the counter are input as one input signal of the comparison circuit and as one input signal of the adder, and respective data fixed to "H" or "L" are input as the other input signal of the comparison circuit and as the other input signal of the adder, which has been set in advance, thereby enabling the successive arbitrary addresses to be set. With the above-mentioned configuration, it is possible to provide an address generation circuit capable of switching the address region when generating refresh address for refreshing a part of the memory region.

A third basic configuration of the semiconductor memory device according to the present invention includes a memory cell array having a plurality of memory cells requiring refresh, a timer circuit that operates in response to a control signal input from the outside and generates a periodic pulse signal, and an internal address generation circuit having a counter and a decode circuit, which operates in response to a periodic pulse signal input externally or the output signal from the timer circuit, so that it generates a refresh address. The semiconductor memory device operates refreshing by using the periodic pulse signal input externally or the periodic pulse signal generated from the timer circuit and a refresh address generated from the internal address generation circuit. The internal address generation circuit generates different addresses between the case where the refresh is carried out by using the periodic pulse signal input externally and the case where the refresh is carried out by using the refresh address generated from the internal address generation circuit, thereby enabling the different memory regions to be refreshed.

With this configuration of the semiconductor memory device, similar to the first basic configuration, it is possible to reduce the memory regions to be refreshed in accordance with the circumferences. Thus, it is possible to reduce the electric current consumption at the time of refresh, thus saving the electric power consumption at the time of refresh.

In the above-mentioned second basic configuration of the semiconductor memory device, the timer circuit is capable of changing the period of the periodic pulse, and when the refresh is carried out by using the output signal of the timer circuit, the period of the periodic pulse output from the timer circuit is varied between the case where the address generated from the first internal address generation circuit is used and the case where the address generated from the second internal address generation circuit is used, thereby changing the period of the refresh. Furthermore, in the semiconductor of this configuration, a fuse is employed for the timer circuit, thereby enabling the period of the periodic pulse signal output from the timer circuit to be changed. With these configurations, when the refresh is carried out with respect to a certain memory region, taking the refresh time of the memory into account, it is possible to increase the refresh period. Thus, it is possible to lower power consumption.

DESCRIPTION OF THE PREFERRED EMBODIMENTS

First Embodiment

Figure 1:
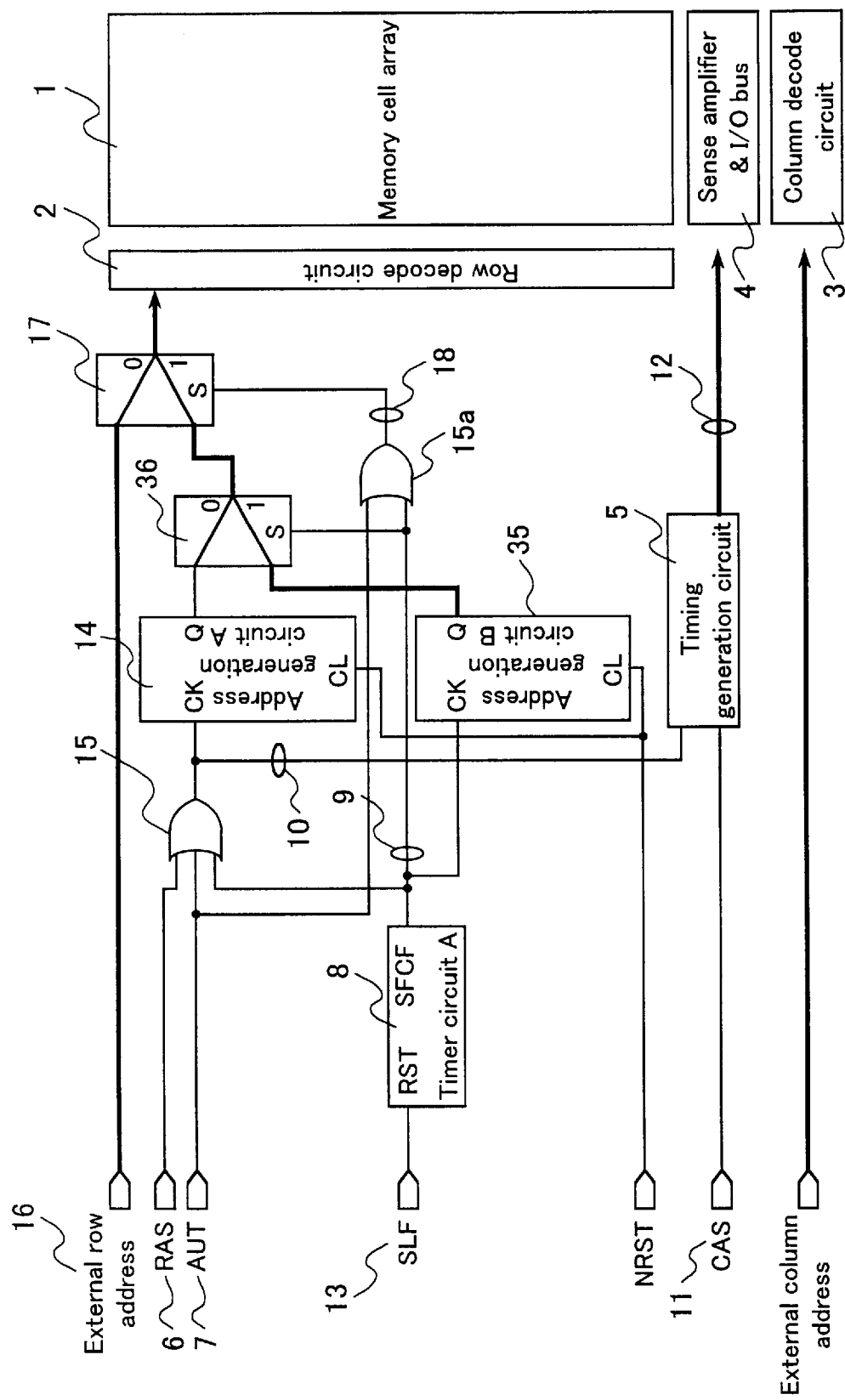
FIG. 1 is a block diagram showing a semiconductor memory device in a first embodiment according to the present invention.

FIG. 1 is a block diagram showing a configuration of a semiconductor memory device in a first embodiment according to the present invention. In FIG. 1, a memory cell array 1, a row decode circuit 2, a column decode circuit 3, a sense amplifier and I/O bus column 4, a timing generation circuit 5, a RAS 6, an AUT 7, a timer circuit A 8, a self-refresh row address strobe signal 9, an OR signal 10, a CAS 11, a timing generation circuit output 12, a SLF 13, an address generation circuit A 14, OR circuits 15 and 15a, an external row address 16, a selector 17 and an OR signal 18 correspond to those in the conventional circuit shown in FIG. 14.

Figure 14:
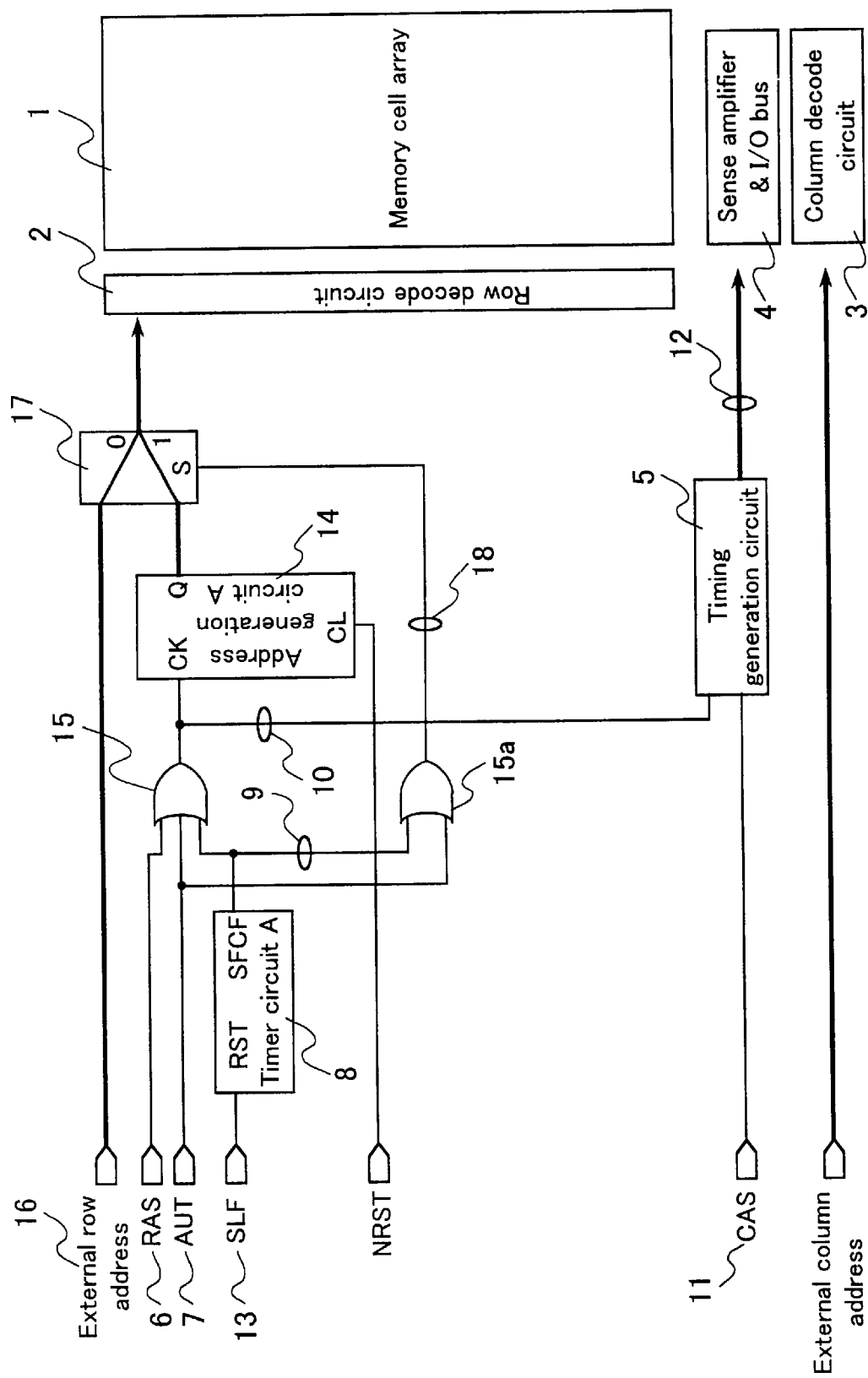
FIG. 14 is a block diagram showing a conventional semiconductor memory device.

The circuit of FIG. 1 has a configuration in which an address generation circuit B 35 and a selector 36 are added to the circuit of FIG. 14. The address generation circuit B 35 generates only the address that is required to be refreshed at the time of self-refresh. The selector 36 selects data of the address generation circuit A 14 (which generates all addresses) and the address generation circuit B 35 for use at the time of the auto-refresh.

As shown in FIG. 1, by using the row address strobe signal 9 for self-refresh (an output signal of the timer circuit A 8) as a select signal of the selector 36, output data of the address generation circuit B 35 are selected at the self-refresh time and output data of the address generation circuit A 14 are selected at the time other than the self-refresh time (at the time of an out-refresh and an usual operation). Thereby, it is possible to refresh all the addresses at the auto-refresh time and to refresh only a memory cell of a part of the address that is required to be refreshed at the self-refresh time (partial refresh).

Figure 2:
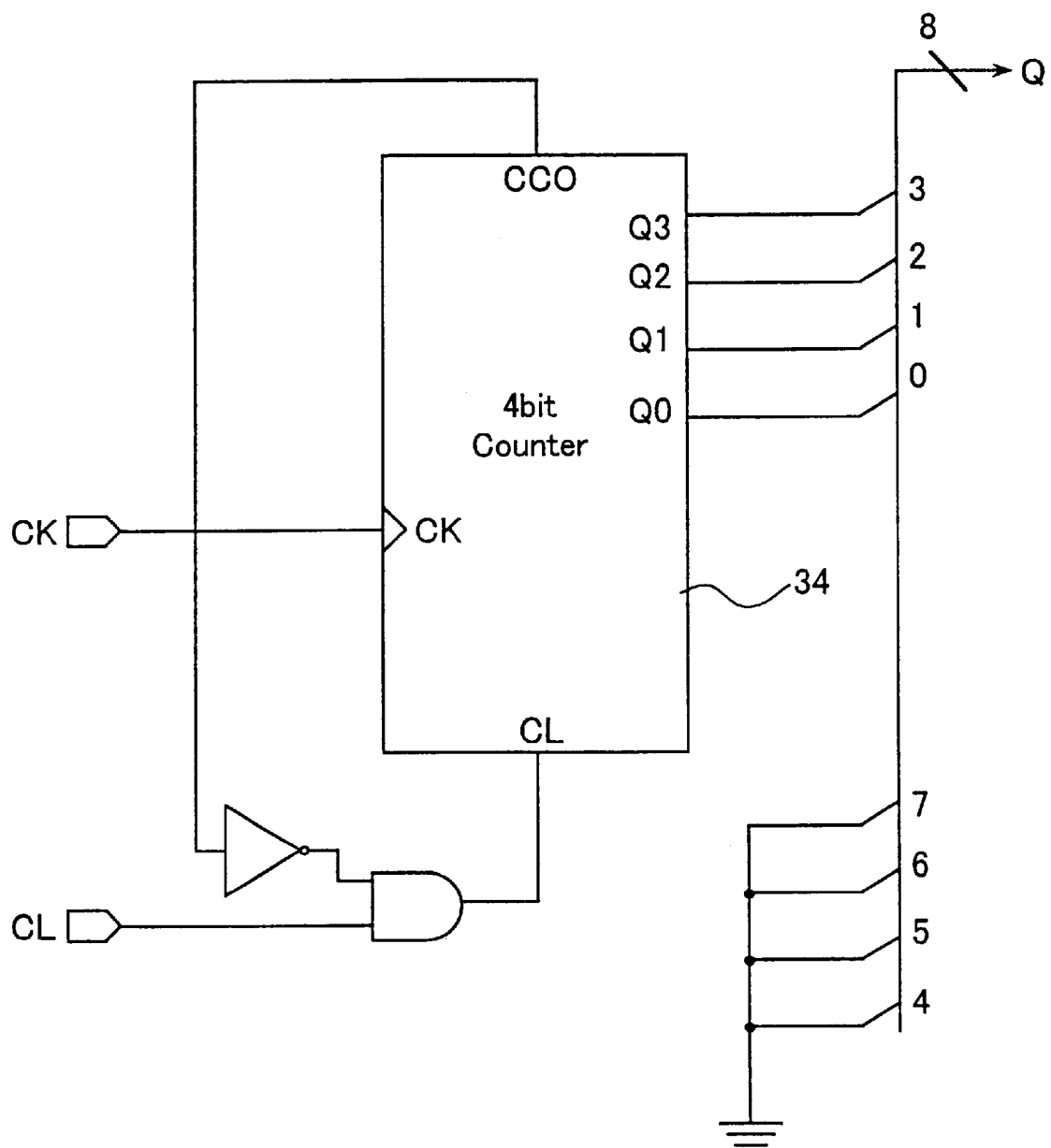
FIG. 2 is a circuit diagram showing an address generation circuit B in the semiconductor memory device of FIG. 1.

FIG. 2 shows an embodiment of a circuit of the address generation circuit B 35. The circuit of FIG. 2 is an example of the circuit of the address generation circuit B 35 when the addresses required to be refreshed are #0 to #F (in this case, entire row addresses are set to 8 bits). The address generation circuit B 35 is composed of a 4-bit counter in which four of higher-order bits are fixed to "L."

Figure 3:
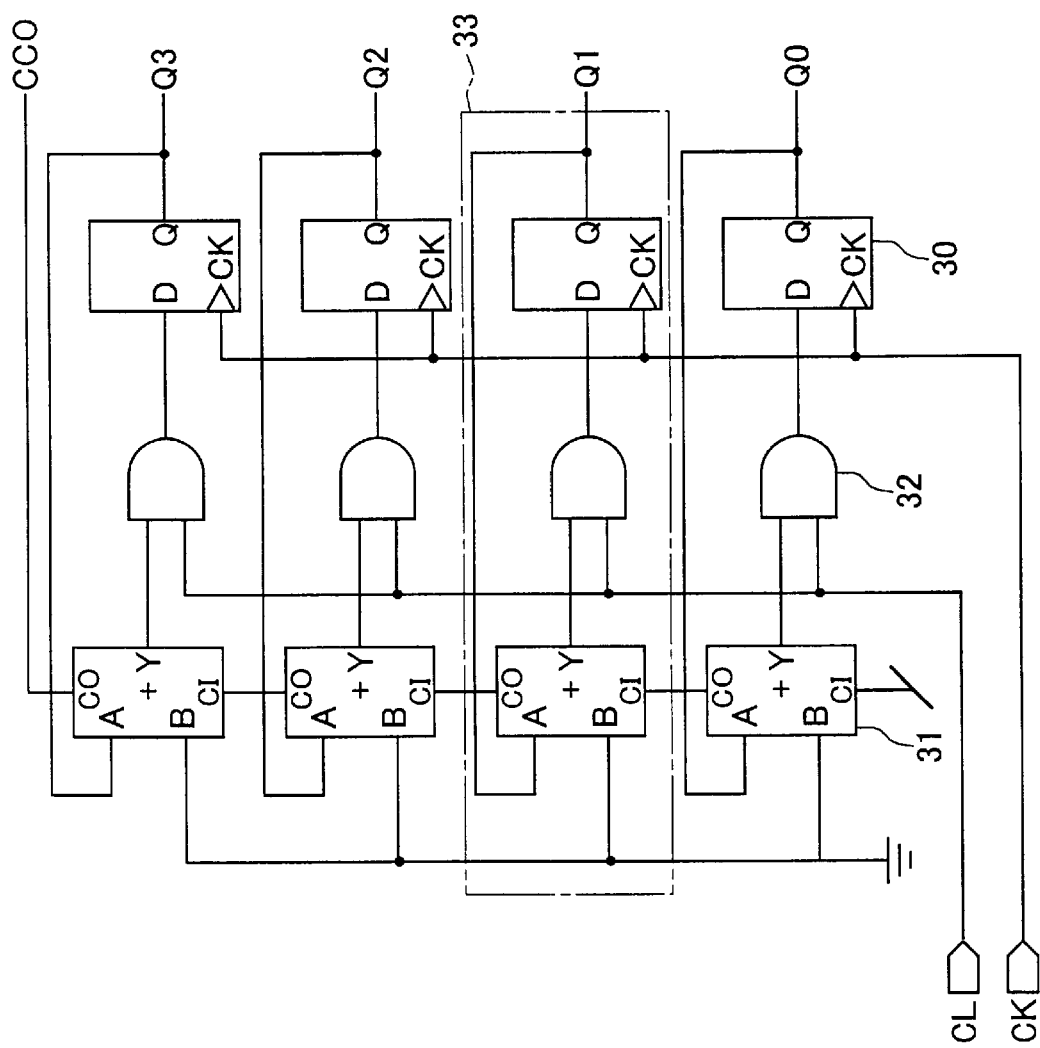
FIG. 3 is a circuit diagram showing a counter circuit used for the address generation circuit B of FIG. 2.

FIG. 3 shows an embodiment of a circuit of the counter 34. The counter 34 includes a D-flip-flop 30, an adder 31 and an AND gate 32.

The specific addresses required to be refreshed are unevenly distributed on a certain address. Thus, the address generation circuit B 35 generally can be composed of only a counter as mentioned above.

Second embodiment

Figure 4:
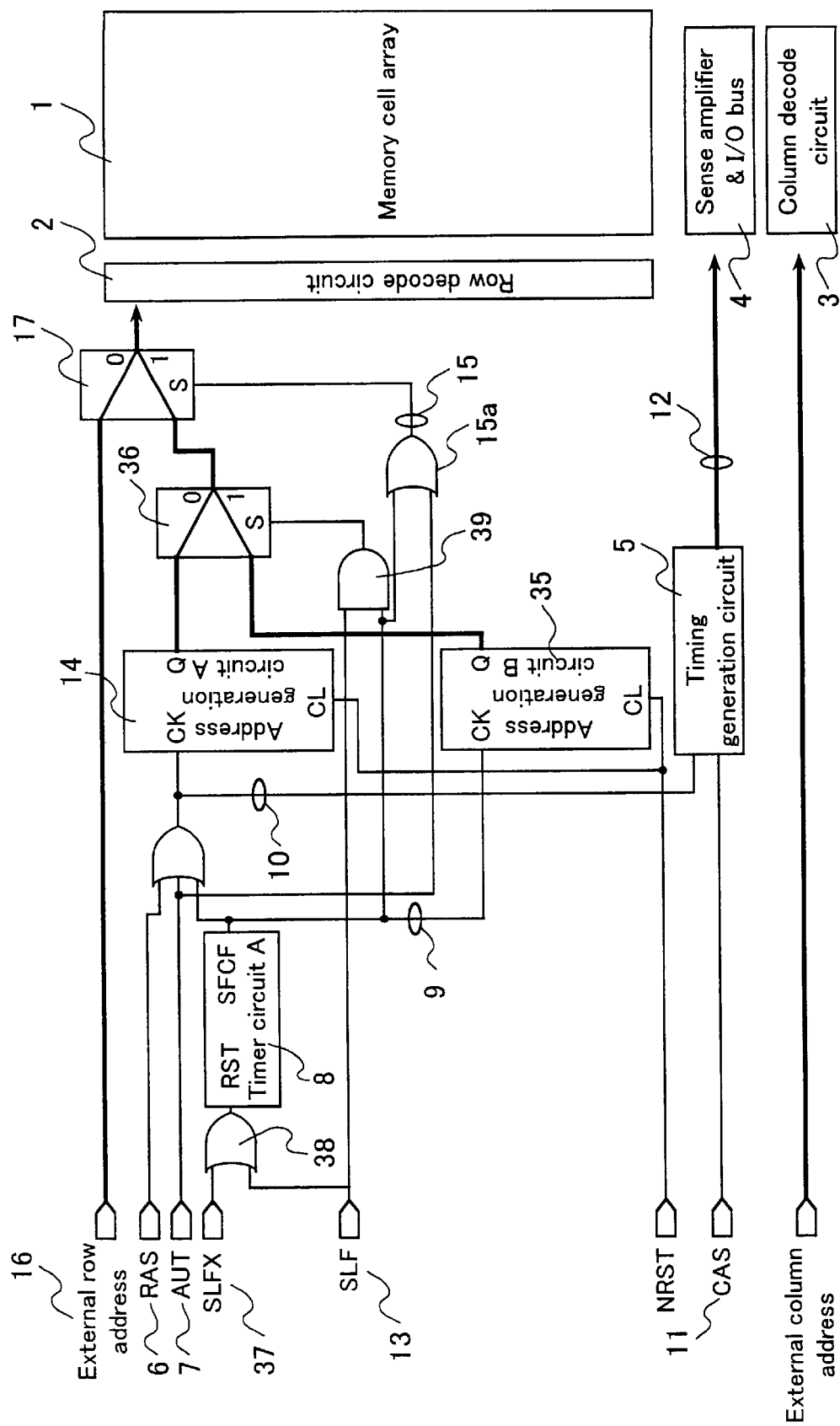
FIG. 4 is a block diagram showing a semiconductor memory device in a second embodiment according to the present invention.

FIG. 4 is a block diagram showing a semiconductor memory device in a second embodiment according to the present invention. The basic parts of the configuration shown in FIG. 4 correspond to those in the semiconductor memory device shown in FIG. 1. In this embodiment, the same members as those in the first embodiment are provided with the same numerals and the explanations therefor are not repeated.

The circuit of FIG. 4 has a configuration in which a new self-refresh mode control signal (hereinafter, SLFX will be referred to) 37, an OR circuit 38 and an AND circuit 39 are added to the circuit of FIG. 1. By adding these circuits, in the self-refresh mode, both an entire address refresh and a partial refresh are possible in this embodiment, while only a partial refresh is carried out in the circuit of FIG. 1.

As a specific operation, when either SLF 13 or SLFX 37 becomes "H", the timer circuit A 8 operates in response to the output of the OR circuit 38 and an address strobe signal for self-refresh 9 (output signal from the timer circuit A 8) is output. Thereby, the refresh address is output from both the address generation circuit A 14 for generating all the address and the address generation circuit B 35 for generating a certain address, and an entire address or specific address is selected by the selector 36.

Switching of the selector 36 is carried out by the select signal generated by the use of the AND circuit 39 so that output data of the address generation circuit B 35 is selected when the SLF 13 is set to "H" during the active period of the row address strobe signal for self-refresh. Therefore, among the two self-refresh modes, when the SLF 13 is set to "H", a partial refresh is carried out, and when the SLFX 37 is set to "H", an entire region refresh can be carried out. Thereby, it is possible to select the optimum self-refresh mode in accordance with the application of use.

Third Embodiment

Figure 5:
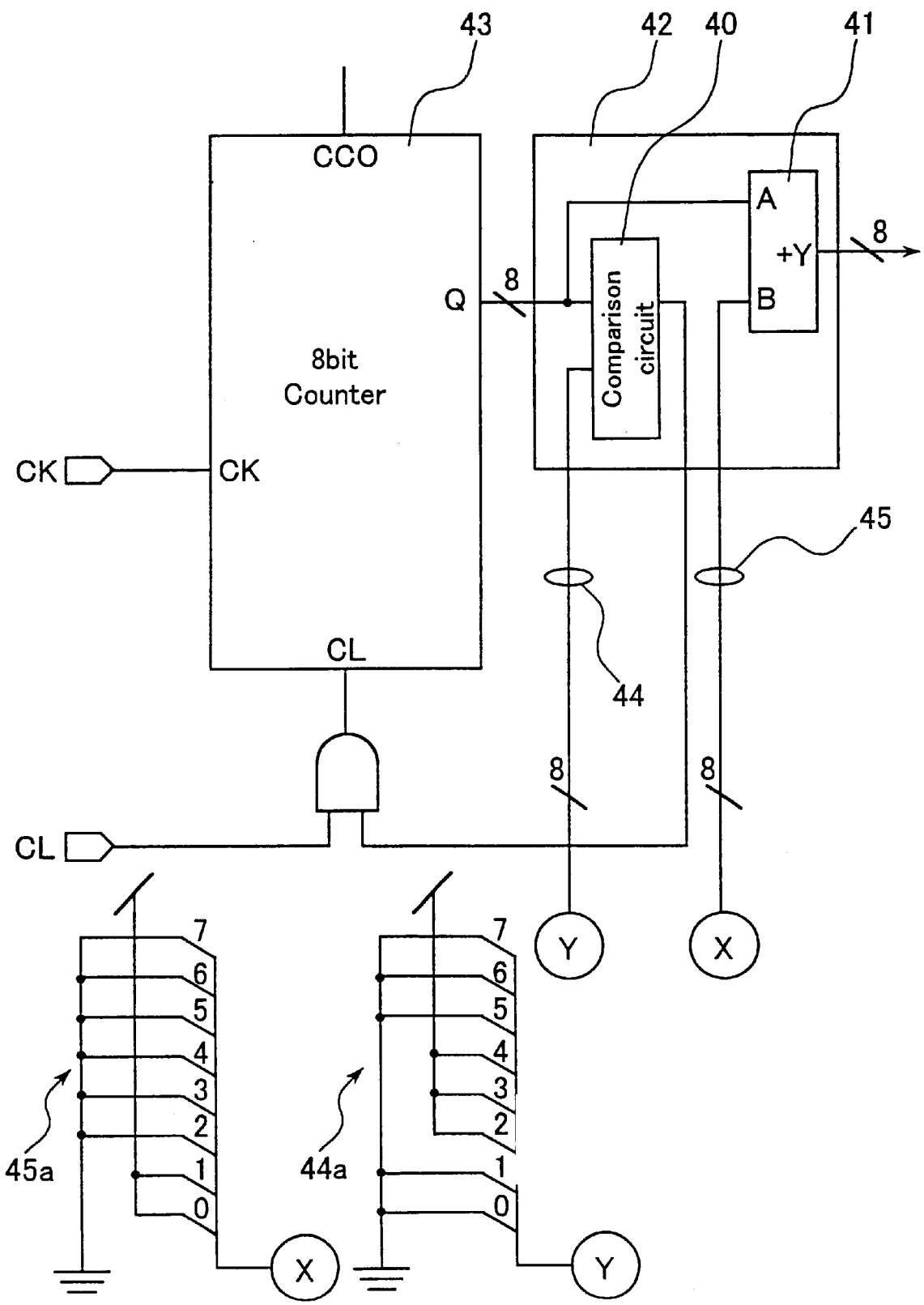
FIG. 5 is a circuit diagram showing an address generation circuit B used in a semiconductor memory device in a third embodiment.

FIG. 5 shows an example of a modification of the address generation circuit B 35 of FIG. 1. In the embodiment of FIG. 5, the number of bits of the row address is set to 8 bits. As shown in FIG. 5, by combining a decode circuit 42 having a comparison circuit 40 and an 8-bit adder circuit 41 with an 8-bit counter 43, it is possible to generate successive arbitrary addresses.

Figure 6:
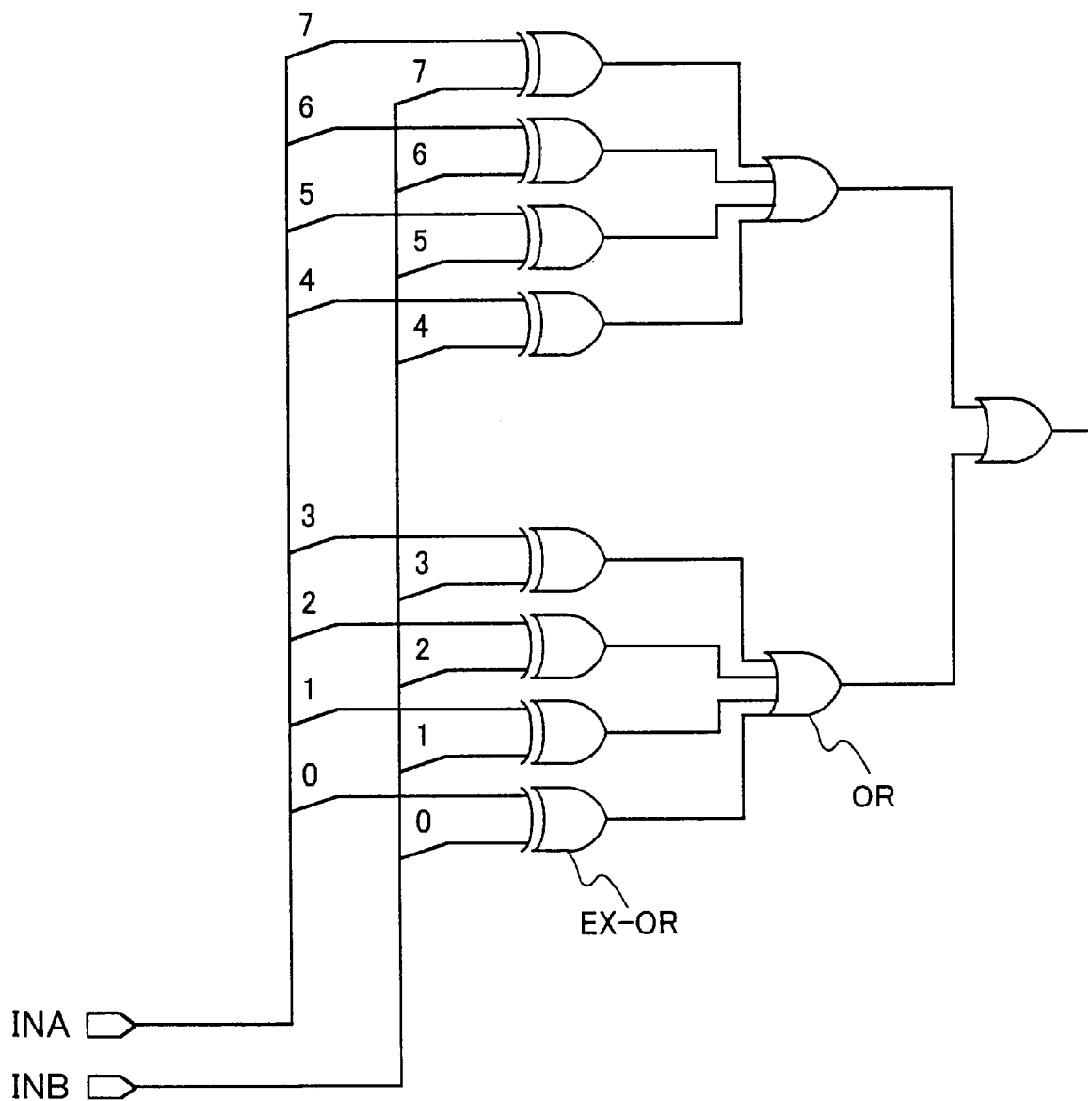
FIG. 6 is a circuit diagram showing a comparison circuit in the address generation circuit B in the FIG. 5.

The operation of this circuit will be explained with reference to the drawings. As shown in FIG. 6, the comparison circuit 40 includes an EXOR circuit and an OR circuit and outputs "L" when the input signal INA agrees with INB. As shown in FIG. 5, an output signal from the counter 43 is input to the INA input of the comparison circuit 40 and data #1C, which has been set in advance by a step value setting circuit 44*a,* is input to INB as a step value 44. When the 8-bit counter 43 counts up to #1C, a reset signal ("L" data) is output from the comparison circuit 40, so that the counter 43 is reset and counts up from 0 again. Thus, the operation of counting from 0 to #1C by the counter 43 is repeated.

Furthermore, as shown in FIG. 5, in the refresh address, the output data of the counter 43 and data #03, which have been set in advance by the off-set value setting circuit 45*a* as an off-set value 45, are input to the adder 41 and the added result is used. Thereby, #3 to #1F are selected as the refresh addresses.

By setting an offset value 45 and a step value 44 to various values like this, it is possible to generate successive arbitrary addresses easily.

Fourth Embodiment

Figure 7:
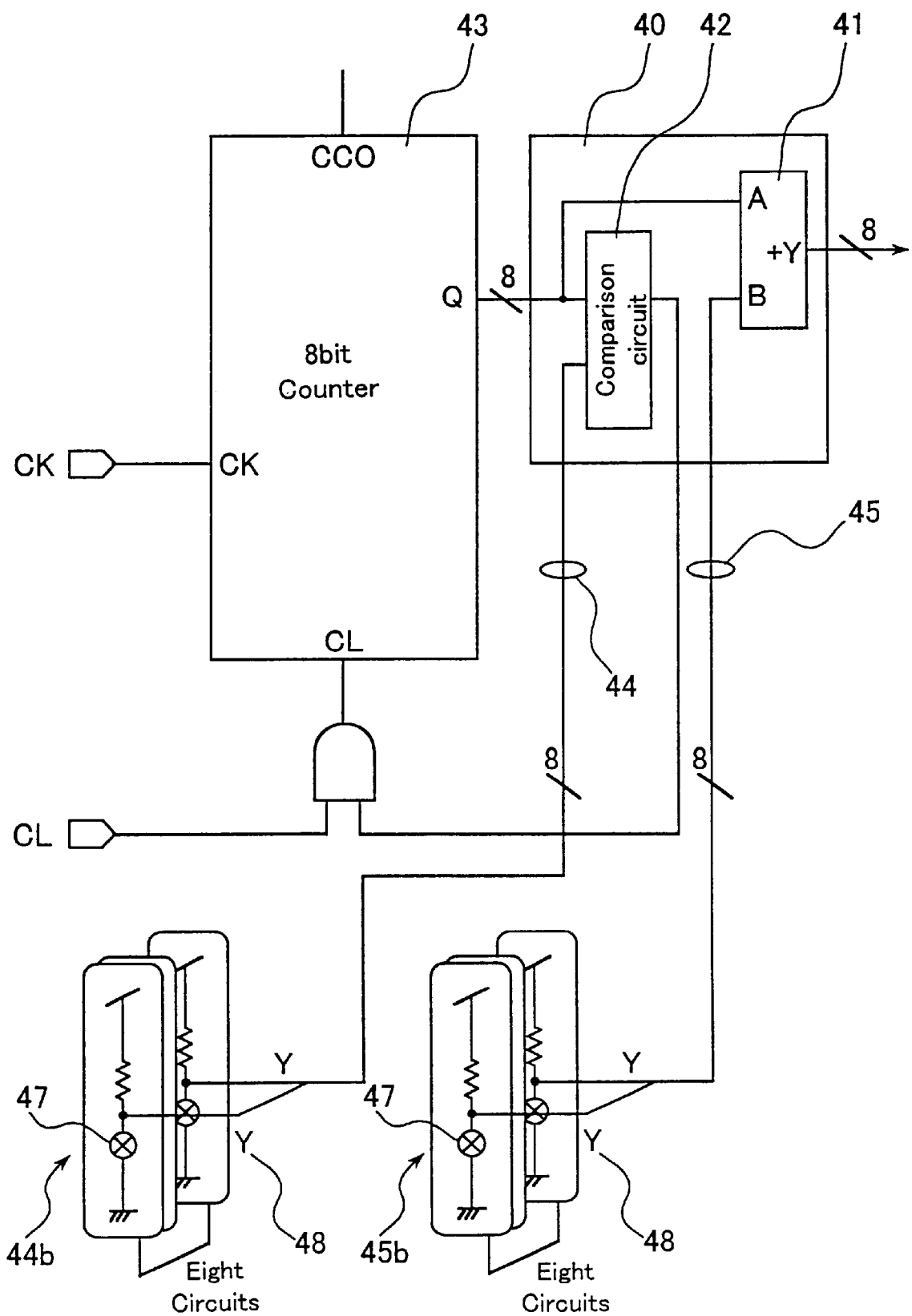
FIG. 7 is a circuit diagram showing an address generation circuit B used for a semiconductor memory device in a fourth embodiment.

A semiconductor memory device of the fourth embodiment of the present invention has a configuration in which the offset value 45 and the step value 44 in FIG. 5 are set by using a fuse. An embodiment of the circuit is shown in FIG. 7. In FIG. 7, the step value setting circuit 44*b* and the offset value setting circuit 45*b* include eight fuses 47, respectively. In a state in which the fuse 47 is not cut, the signal line Y 48 is fixed to "L" level, and by cutting the fuse 47, the signal line Y 48 is fixed to "H" level.

With this configuration, it is possible to set the offset value 45 and the step value 44 even after a product is completed and thus to determine the optimum partial refresh address.

Fifth Embodiment

Figure 8:
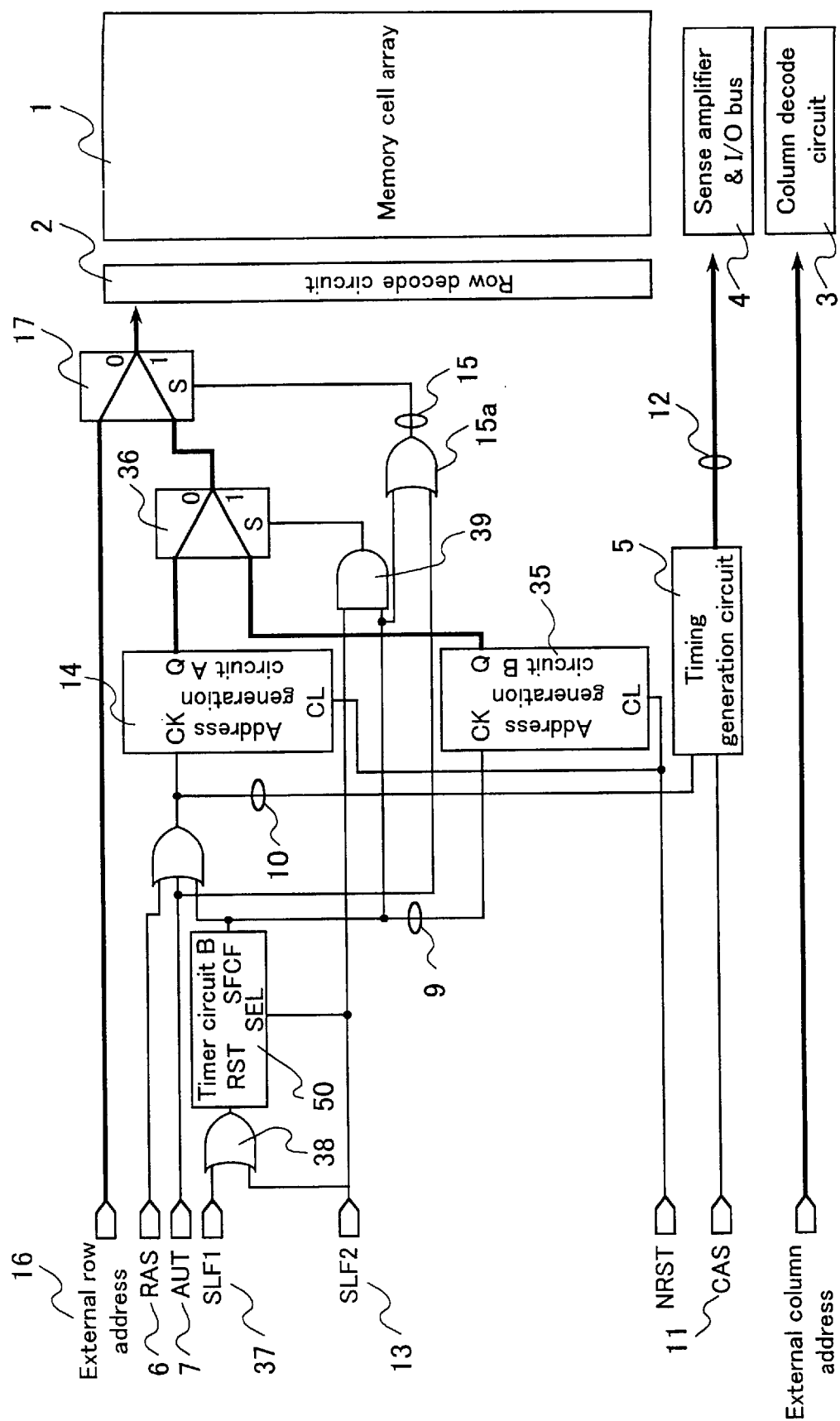
FIG. 8 is a block diagram showing a semiconductor memory device in a fifth embodiment according to the present invention.

FIG. 8 is a block diagram showing a semiconductor memory device in a fifth embodiment according to the present invention. The basic parts of the configuration shown in FIG. 8 correspond to the semiconductor memory device of FIG. 4. In this embodiment, the same elements as those in the first embodiment are provided with the same numerals and the explanations therefor are not repeated.

The configuration of FIG. 8 is characterized in that a timer circuit B 50 capable of outputting the different periodic address strobe signal 9 is used in order to vary the period of the address strobe signal 9 for self-refresh shown in FIG. 4 between the case of the partial refresh and the case of the entire refresh.

Figure 9:
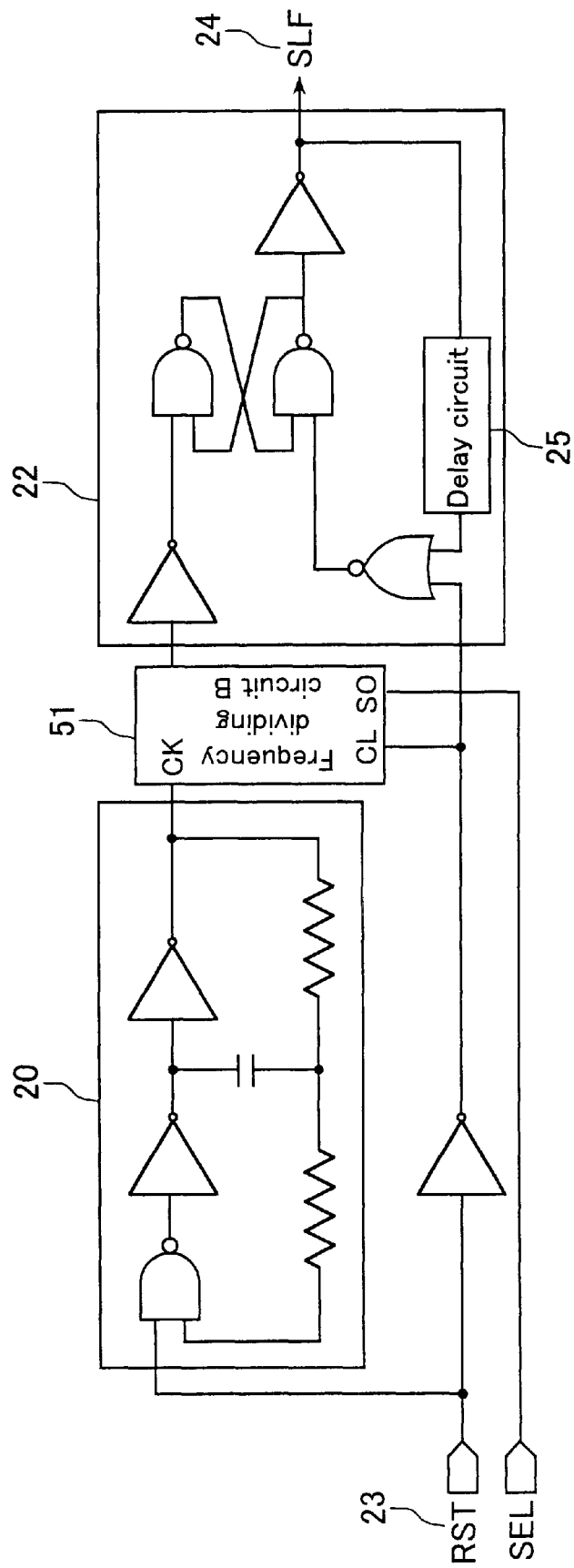
FIG. 9 is a circuit diagram showing a timer circuit in the semiconductor memory device of FIG. 8.
Figure 15:
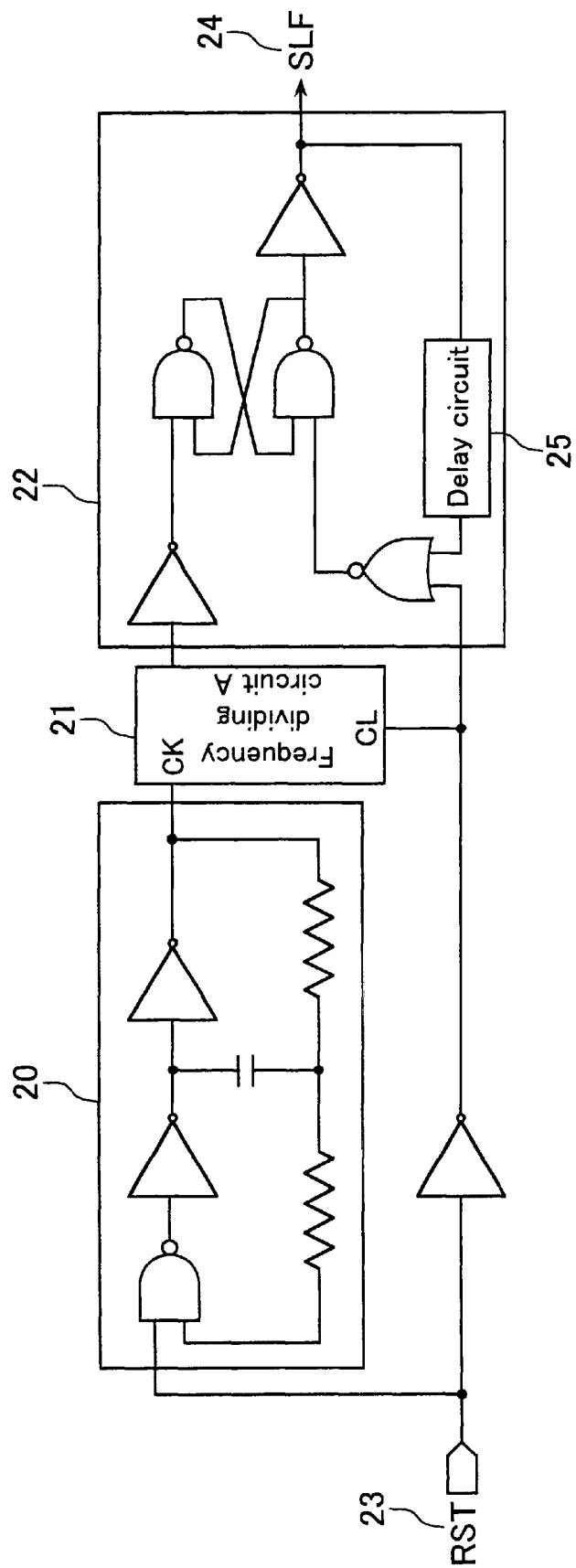
FIG. 15 is a circuit diagram showing a timer circuit in the semiconductor memory device of FIG. 14.

FIG. 9 shows an embodiment of the timer circuit B 50. In FIG. 9, an oscillation circuit 20, a signal generation circuit 22, a RST signal 23 and an output signal 24 are the same as in those of FIG. 15. The circuit of FIG. 9 is different from the circuit of FIG. 15 in that the refresh period is changed by a frequency-dividing circuit B 51.

Figure 10:
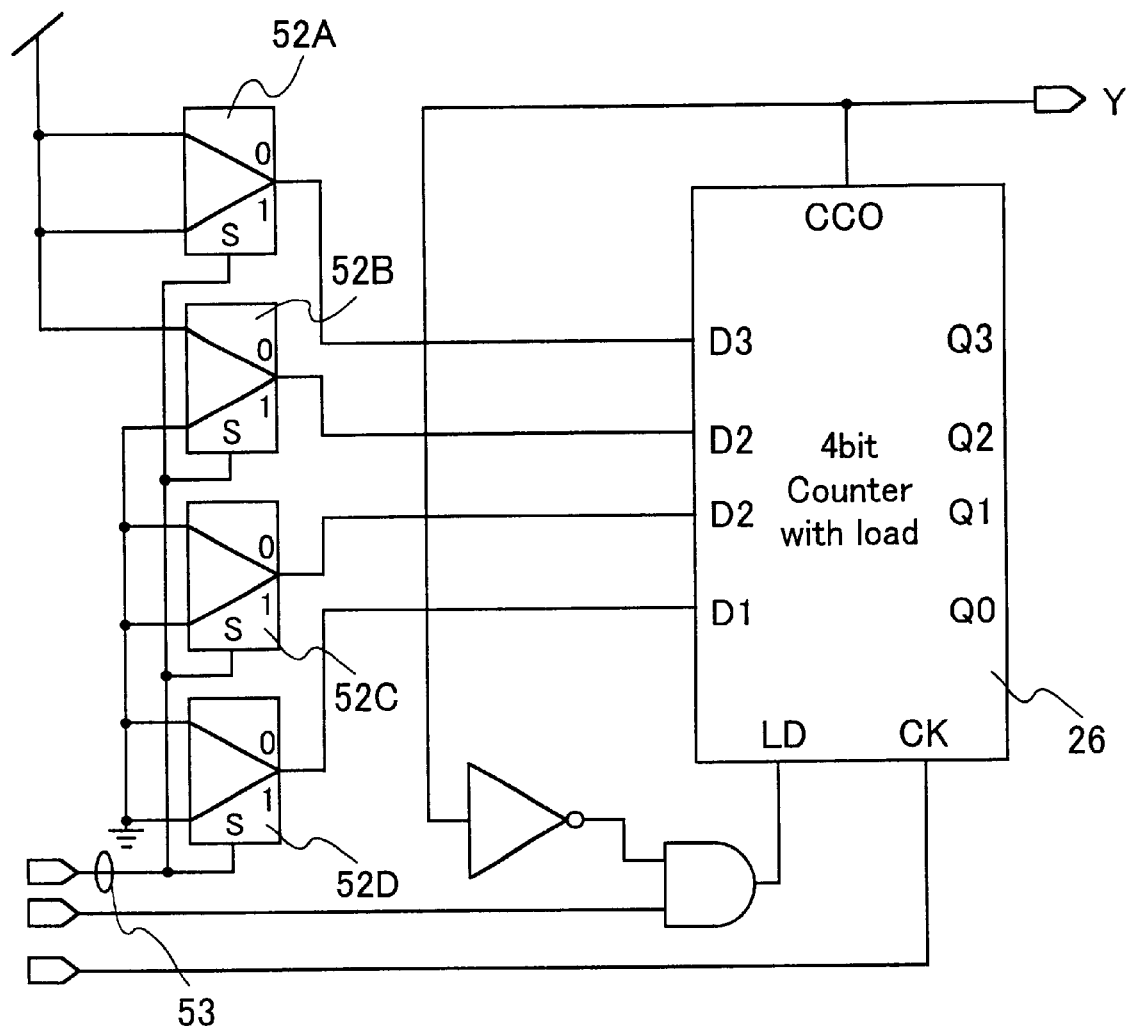
FIG. 10 is a circuit diagram showing a frequency dividing circuit B used in the timer circuit of FIG. 9.
Figure 16:
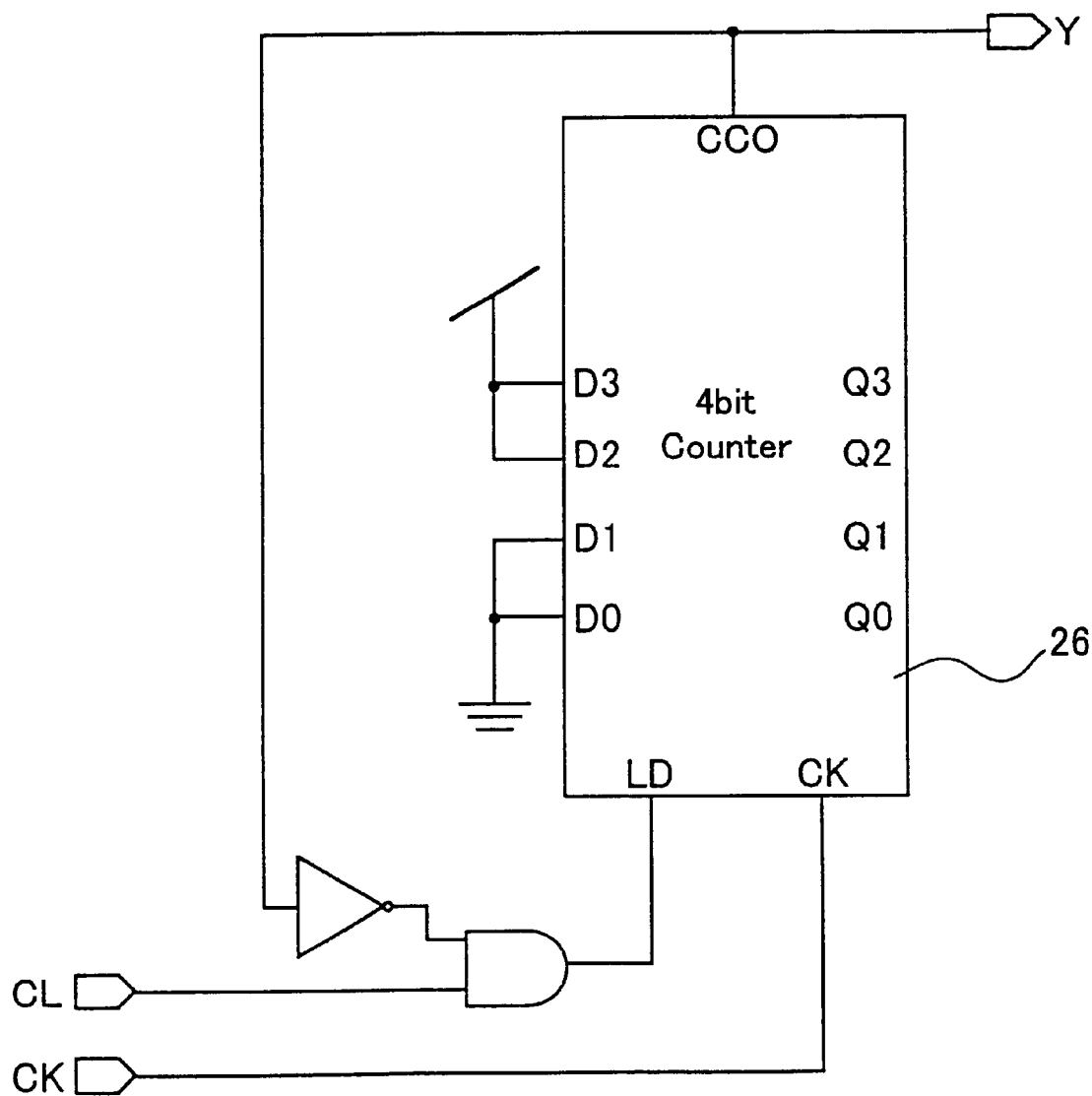
FIG. 16 is a circuit diagram showing a frequency dividing circuit A used for the timer circuit of FIG. 15.
Figure 17:
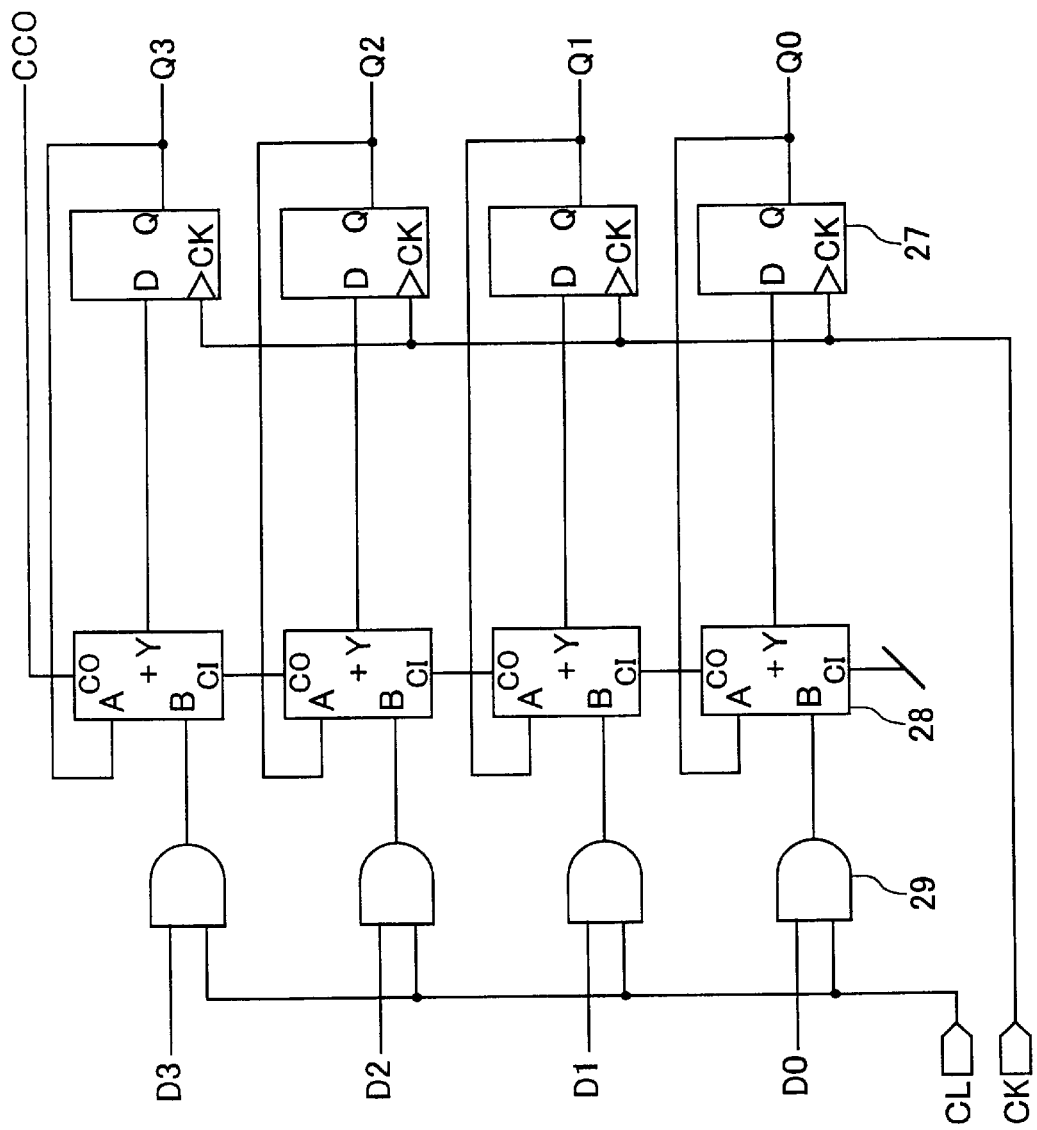
FIG. 17 is a circuit diagram showing a counter circuit composing an address generation circuit C of FIG. 16.

FIG. 10 shows an embodiment of the frequency-dividing circuit B 51. Its basic configuration is the same as the configuration shown in FIG. 16 as an embodiment of the frequency-dividing circuit A 21 of FIG. 15. The circuit of FIG. 10 is different from the circuit of FIG. 16 in that selectors 52A, 52B, 52C and 52D are connected to a 4-bit counter circuit 26. The ratio of the frequency division is switched by switching the two different load values by using the selectors 52A, 52B, 52C and 52D, thereby enabling the row address strobe signal 9 to have different periods to be output.

In the configuration shown in FIG. 10, the load value is "1100" (MSB first) when the select signal 53 is "L" and the frequency dividing circuit B 51 operates as a quarter frequency circuit. Furthermore, when the select signal 53 is "H", the load value is "1000" (MSB first) and the frequency dividing circuit B 51 operates as a ⅛ frequency circuit.

With this frequency circuit, a timer circuit B 50 of FIG. 8 can generate the address strobe signal for self-refresh 9 having a double period at the partial refresh time as compared with the entire region refresh time. In this case, however, the region to be refreshed partially is required to be half or less of the entire region.

By extending the refresh period at the partial refresh time like this, it is possible to lower the electric power consumption at the self-refresh time.

Sixth Embodiment

Figure 11:
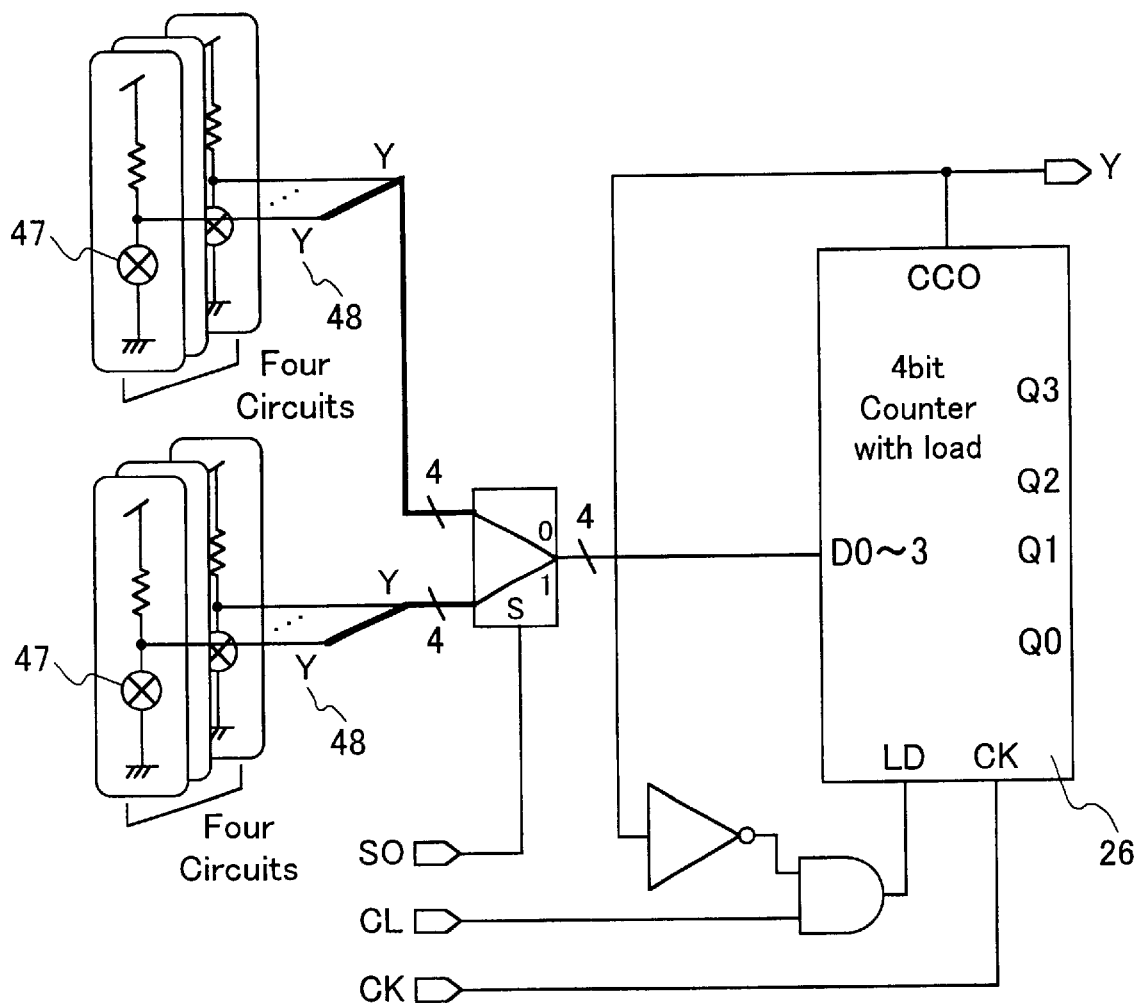
FIG. 11 is a circuit diagram showing a frequency dividing circuit B used for the timer circuit composing a semiconductor memory device in a sixth embodiment.

The semiconductor memory device according to the sixth embodiment of the present invention has a configuration in which the load value of the counter 26 shown in FIG. 10 is set by using a fuse 47 as shown in FIG. 11. The operations when the fuse 47 is cut and not cut are the same as those in the fourth embodiment shown in FIG. 7. With this configuration, it is possible to set to the optimum setting value in accordance with the system even after a product is completed and to realize lower power consumption during standby.

Seventh Embodiment

Figure 12:
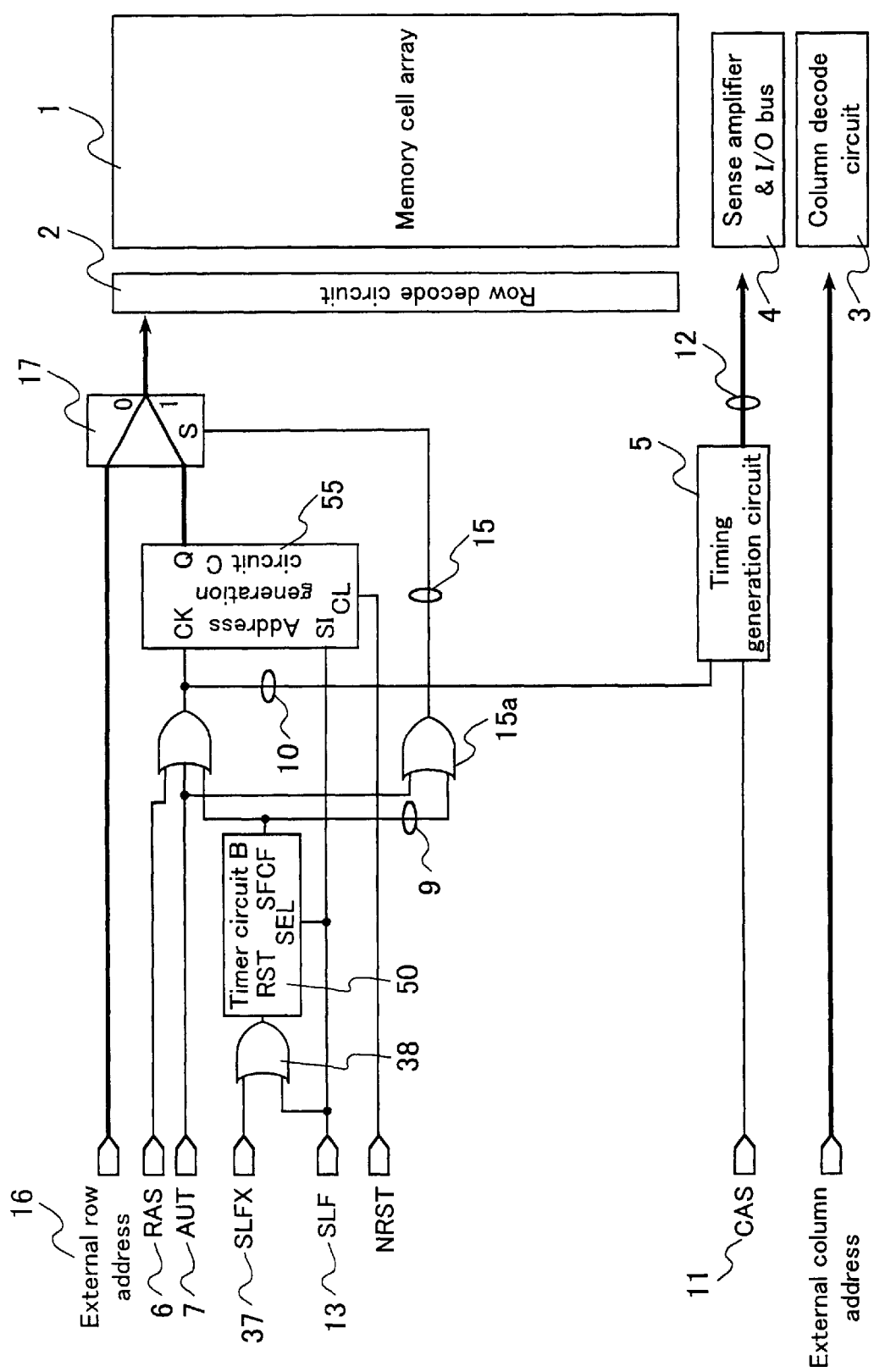
FIG. 12 is a block diagram showing a semiconductor memory device for a seventh embodiment according to the present invention.

FIG. 12 is a block diagram showing a semiconductor memory device in a seventh embodiment according to the present invention. The basic parts of the configuration of FIG. 12 corresponds to those in the semiconductor memory device shown in FIG. 8. In this embodiment, the same elements as in the first embodiment are provided with the same numerals and the explanations therefor are not repeated.

The configuration of FIG. 12 is characterized in that unlike the circuit shown in FIG. 8, it does not have two different address generation circuits A 14 and B 35 and it is possible to generate the address for an entire region refresh and the address for a partial refresh using one address generation circuit C 55, thereby reducing a redundant circuit.

Figure 13:
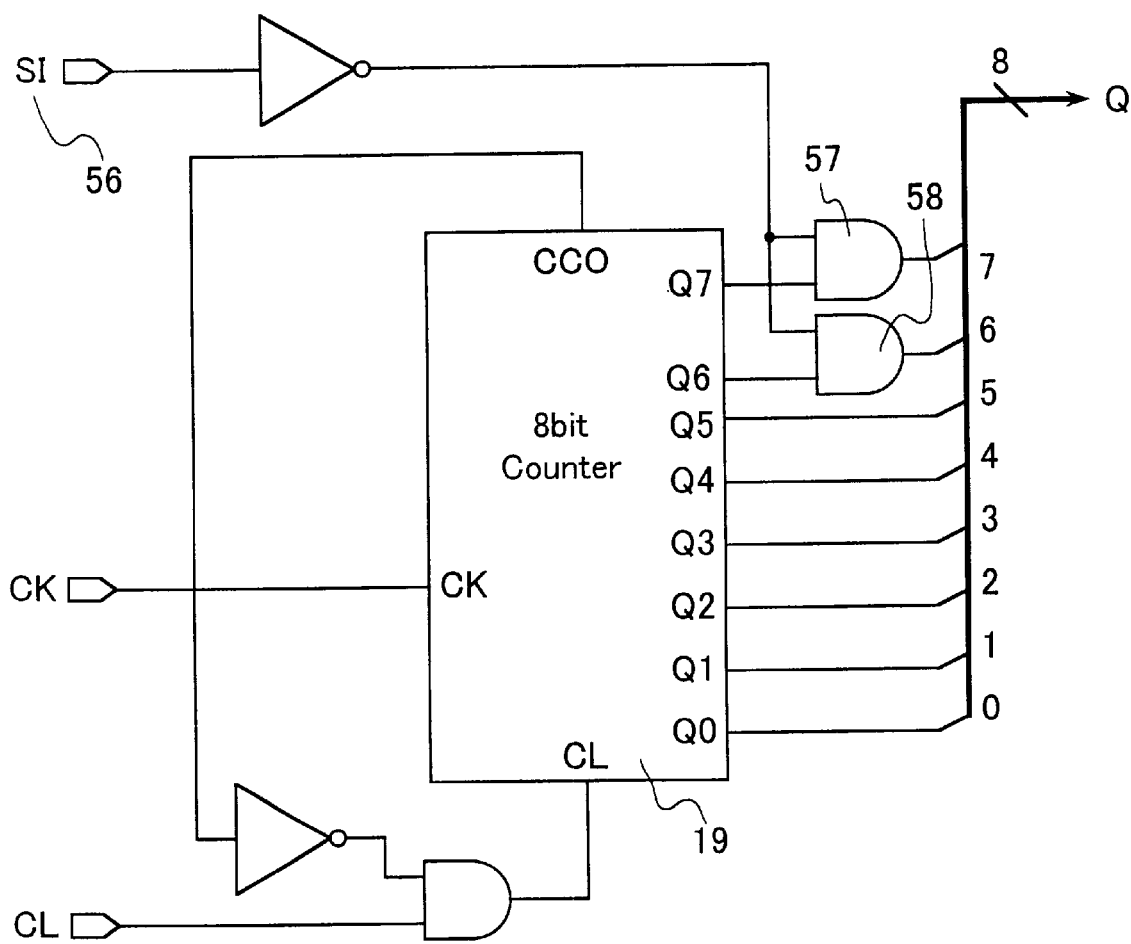
FIG. 13 is a circuit diagram showing a counter circuit used for the address generation circuit C of FIG. 12.
Figure 18:
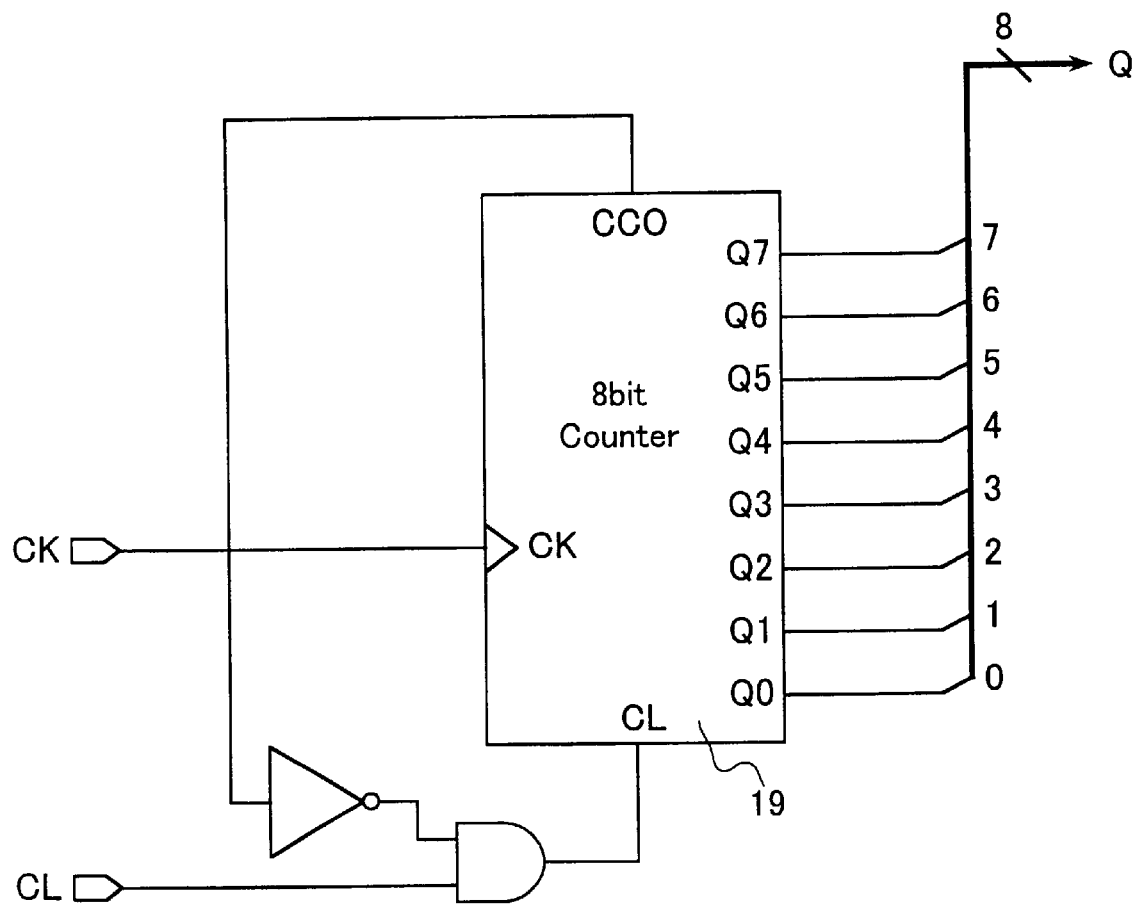
FIG. 18 is a circuit diagram showing an address generation circuit A in the semiconductor memory device of FIG. 14.

FIG. 13 shows an embodiment of the address generation circuit C 55. The counter 19 in FIG. 13 is the same as that used in the address generation circuit A 14 shown in FIG. 18. In the configuration of FIG. 13, the input signal SI 56 that becomes "H" at the time of a partial refresh is input, and the output Q 7 and Q 6 of the counter 19 are gated by AND circuits 57 and 58 with the signal SI 56. Thereby, at the partial refresh time, the address of the seventh bit and eighth bit are fixed to "L". Therefore, in the case of the partial refresh, only addresses for the lower six bits are refreshed and a region corresponding to a quarter of the entire region is subjected to refresh. In the case where the input signal SI 56 is "L", the entire region is subjected to refresh.

By adding a circuit such as a decode circuit to the counter 19, it is possible to use one address generation circuit 55 for generating the address for an entire region refresh and the address for a partial refresh.

As mentioned above, according to the present invention, it is possible to carry out refresh in only the region requiring retaining data in a system in which all data are not required to be retained in the memory when the system is on standby (in the sleep mode, etc.). Therefore, it is possible to reduce a refresh current significantly as compared with the conventional memory in which the entire region is subjected to refresh.

Furthermore, as the refresh region is reduced, it is possible to extend the refresh period. By setting to the optimum refresh period, it is possible to realize lower power consumption.

The invention may be embodied in other forms without departing from the spirit or essential characteristics thereof. The embodiments disclosed in this application are to be considered in all respects as illustrative and not limitative, the scope of the invention is indicated by the appended claims rather than by the foregoing description, and all changes which come within the meaning and range of equivalency of the claims are intended to be embraced therein.

What is claimed is:

1. A semiconductor memory device comprising
a memory cell array having a plurality of memory cells requiring refresh,
a first internal address generation circuit,
a timer circuit that operates in response to a control signal input externally and generates a periodic pulse signal, and
a second internal address generation circuit that operates in response to an output signal from the timer circuit, wherein:
the semiconductor memory device has
a first refresh mode for refreshing data stored in the memory cell by using a periodic pulse signal input externally and a refresh address generated from the first internal address generation circuit that operates in response to the periodic pulse signal input externally, and
a second refresh mode for refreshing data stored in the memory cell by using a periodic pulse signal generated from the timer circuit and a refresh address generated from the second internal address generation circuit, and
different memory regions are refreshed in the first refresh mode versus the second refresh mode.

2. The semiconductor memory device according to claim 1, wherein a refresh address generated from the first internal address generation circuit is used for refreshing the entire memory region and a refresh address generated from the second internal address generation circuit is used for refreshing only the memory cells in a specific part of the memory region.

3. The semiconductor memory device according to claim 1, wherein the first internal address generation circuit and the second internal address generation circuit comprise respective counters and the refresh regions are changed depending upon the number of bits of each of the counter.

4. The semiconductor memory device according to claim 1, wherein the second internal address generation circuit comprises a counter, a comparison circuit and an adder, wherein
output data of the counter are input as one input signal of the comparison circuit and as one input signal of the adder, and respective data, which are preset and fixed to "H" or "L", are input as the other input signal of the comparison circuit and as the other input signal of the adder, thereby enabling successive arbitrary addresses to be set.

5. A semiconductor memory device, comprising:
a memory cell array having a plurality of memory cells requiring refresh,
a first internal address generation circuit,
a timer circuit that operates in response to a control signal input externally and generates a periodic pulse signal, and
a second internal address generation circuit that operates in response to the output signal from the timer circuit, wherein:
the semiconductor memory device has
a first refresh mode for refreshing data stored in the memory cell by using a periodic pulse signal input externally and a refresh address generated from the first internal address generation circuit that operates in response to the periodic pulse signal input externally,
a second refresh mode for refreshing data stored in the memory cell by using a periodic pulse signal generated from the timer circuit and a refresh address generated from the first internal address generation circuit that operates in response to the internally generated pulse signal, and a third refresh mode for refreshing data stored in the memory cell by using a periodic pulse signal generated from the timer circuit and the refresh address generated from the second internal address generation circuit, and in the first refresh mode and the second refresh mode, the same memory region is refreshed, and in the third refresh mode, a memory region that is different from the memory regions that are refreshed by the first and the second refresh modes is refreshed.

6. The semiconductor memory device according to claim 5, wherein the refresh address generated from the first internal address generation circuit is used for the refresh of the entire memory region and the refresh address generated from the second address generation circuit is used for refresh of only memory cells of a part of the memory region.

7. The semiconductor memory device according to claim 5, wherein the timer circuit is capable of changing the period of the periodic pulse, and when the refresh is carried out by using the output signal of the timer circuit, the period of the periodic pulse output from the timer circuit is varied between the case where the address generated from the first internal address generation circuit is used and the case where the address generated from the second internal address generation circuit is used, thereby changing the period of the refresh.

8. The semiconductor memory device according to claim 7, wherein a fuse is employed for the timer circuit, thereby enabling the period of the periodic pulse signal output from the timer circuit to be changed.

9. The semiconductor memory device according to claim 5, wherein the first internal address generation circuit and the second internal address generation circuit comprise respective counters and the refresh regions are changed depending upon the number of bits of each of the counter.

10. The semiconductor memory device according to claim 5, wherein the second internal address generation circuit comprises a counter, a comparison circuit and an adder, wherein output data of the counter are input as one input signal of the comparison circuit and as one input signal of the adder, and respective data, which are preset and fixed to "H" or "L", are input as the other input signal of the comparison circuit and as the other input signal of the adder, thereby enabling successive arbitrary addresses to be set.

11. A semiconductor memory device, comprising:

a memory cell array having a plurality of memory cells requiring refresh, a timer circuit that operates in response to a control signal input externally and generates a periodic pulse signal, and an internal address generation circuit having a counter and a decode circuit, which operates in response to a periodic pulse signal input externally or the output signal from the timer circuit, so as to generate a refresh address; wherein the semiconductor memory device operates refreshing by using the periodic pulse signal input externally or the periodic pulse signal generated from the timer circuit and a refresh address generated from the internal address generation circuit, and the internal address generation circuit generates different addresses between the case where the refresh is carried out by using the periodic pulse signal input externally and the case where the refresh is carried out by using the refresh address generated from the internal address generation circuit, thereby enabling different memory regions to be refreshed.

* * * * *